(12) United States Patent
Lee et al.

(10) Patent No.: US 6,570,246 B1
(45) Date of Patent: May 27, 2003

(54) MULTI-DIE PACKAGE

(75) Inventors: Tzung-Han Lee, Taipei (TW); Kun-Chi Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/064,110

(22) Filed: Jun. 12, 2002

(51) Int. Cl.[7] .................. H01L 23/48; H01L 23/52
(52) U.S. Cl. ............... 257/690; 257/698; 257/723; 257/724; 257/730
(58) Field of Search .................. 257/690, 698, 257/723, 724, 730

(56) References Cited

U.S. PATENT DOCUMENTS 5,006,925 A * 4/1991 Bregman et al. ........... 257/717
5,545,924 A * 8/1996 Contolatis et al. .......... 257/724
5,817,986 A * 10/1998 Davidson et al. ........... 174/250
6,078,102 A * 6/2000 Crane et al. ................ 257/730

* cited by examiner

Primary Examiner—David Nelms
Assistant Examiner—Tu-Tu Ho
(74) Attorney, Agent, or Firm—Winston Hsu

(57) ABSTRACT

A multi-chip package which has a L-shaped plate and a plurality of dies arranged on the L-shaped plate. The L-shaped plate has a die package region, a plurality of solder bump pads disposed in the die package region, a plurality of pins electrically connected to a printed circuit board (PCB), and an internal circuit inside the L-shaped plate electrically connected to the plurality of solder bump pads and corresponding pins. Each die includes a plurality of bonding pads on an active surface of the die, and the bonding pads are electrically connected to corresponding solder bump pads.

18 Claims, 10 Drawing Sheets

MULTI-DIE PACKAGE

BACKGROUND OF INVENTION

1. Field of the Invention

The present invention relates to a semiconductor package, and more particularly, to a multi-die package.

2. Description of the Prior Art

It is now a leading trend for fabricating devices or electronic products, such as notebooks, PDAs and digital cameras with small, thin, light, multi-functional high-density packages for semiconductor devices that contain a high level of integration. Raising the integration level of a package depends on the size of package carrier and the space between the die and the carrier.

For a single die package, a lead on chip (LOC) package is commonly used to reduce the space between the die and the carrier. In the LOC frame, the leads of the carrier can be extended to the bonding pads in the center of the die and the leads are connected with the active surface of the die to provide the die with a physical support. Therefore, the size of package can be reduced. Wherein, the carrier is made of a conventional LOC lead frame or a laminate substrate with an opening.

For a multi-die package, a multi-chip module (MCM) is often seen in a high-density package. The MCM can simultaneously package many dies in one carrier according to different design demands. The MCM not only reduces the size of package, decreases the production costs and the signal transition path, but also increases bulk efficiency. The MCM is usually set up on a printed circuit board (PCB). A plurality of dies are arranged on a same surface of the PCB. The dies and the PCB are connected with each other by using a wire bonding technique, a tape automatic bonding (TAB) technique or a flip chip technique.

A conventional multi-die package 20 is explained with reference to FIG. 1 to FIG. 2. Referring to FIG. 1, an active surface of at least one die 12 is turned upward. An insulation glue 14 is smeared over a back of the die 12, and the die 12 is mounted in a predetermined region of a plate 10. The die 12 is baked and solidified at a temperature of about 150° C. Then, a wire bonding technique is utilized to electrically connect a bonding pad 16 of the die 12 and a corresponding terminal (not shown) of the plate 10 with a copper wiring 15. A molding material 18 is used to enclose the die 12 and the copper wiring 15 and then the molding material 18 is baked to solidify. After that, an etching process is performed to form a plurality of solder ball pads (not shown) under the plate 10, and a plurality of solder balls 19 are welded to the plurality of solder ball pads. The solder balls 19 are electrically connected to the package 20 and a PCB (not shown). An internal circuit (not shown) is arranged inside the plate 10 and electrically connected to the terminals of the plate 10 and the solder balls 19, so the die 12 can electrically connect to a PCB by using the copper wiring 15, the internal circuit in the plate 10 and the solder balls 19. The plurality of solder ball pads are arrayed as a ball grid array (BGA). In addition, the plate 10 is a laminate substrate, the insulation glue 14 is made of polymer, and the molding material 18 is made of ceramic, glass epoxy or BT resin.

In the conventional wire bonding method, a square measure of the package is too large to conform to a requirement of small size. Therefore, a chip scale package is developed, which has a smaller distance between the solder balls. The chip scale package size is similar to a die, and the thickness of the chip scale package does not have to take into consideration a wiring radian height. The chip scale package is a high-density package by using a bare chip and a flip chip technique. Referring to FIG. 2, in the conventional flip chip scale package 28, an active surface of at least one die 12 is turned downward and mounted on a predetermined surface of the plate 10 by using a flip chip technique. A plurality of bump pads 22 are located on the plate 10 electrically connected to corresponding solder balls 24. The bonding pads 16 on the active surface of the die 12 are electrically connected to the corresponding bump pads 22. A filling material 26, such as resin is filled spaces between the die 12 and plate 10, on the outside of the solder balls 24. Thus, an under fill region (not shown) is formed to reduce a stress of the solder balls 24 generated from different thermal expansion coefficients of the plate 10 and the die 12.

In the prior art multi-die package, the dies are arranged on the same side of the PCB. When too many dies are arranged on the PCB, a package square measure is larger and does not conform to a present leading trend. Transmission via circuit lines between each die are limited by a complicated transition path in the PCB. Due to the distance of the signal transition path is longer, the resistance is increased. Therefore, bulk efficiency is reduced. Although the flip chip technique is utilized to reduce the package size, the distances between bonding pads of the dies will become narrower due to the smaller size of die. The height of the solder ball is reduced to limit the gap between the filling material and the die. It is difficult to form the under fill region. A known good die method is utilized in the package presently, but the yield is low while costs are high.

SUMMARY OF INVENTION

It is therefore an object of the present invention to provide a multi-die package to reduce signal transition path between each die and raise bulk efficiency.

It is another objective of the present invention to provide a multi-die package. The package is not only mechanically strengthened to prevent the die from surrounding damage, collision, chemical material or moisture, but also reduces a bulk package size and raises package integration.

In accordance with the objective of the present invention includes: (1) an L-shaped plate comprising a die package region, a plurality of bump pads located in the die package region, a plurality of pins electrically connected to a printed circuit board (PCB), and an internal circuit arranged inside the L-shaped plate electrically connected to the plurality of bump pads and corresponding pins, and (2) a plurality of dies arranged in the die package region of the L-shaped plate, each die comprising a plurality of bonding pads on an active surface of the die, and the plurality of bonding pads are electrically connected to the corresponding solder bump pads.

The present invention utilizes the L-shaped plate as a package frame to package a plurality of dies with same or different functions for forming a package. If there are too many dies in the same package, the L-shaped plate can be extended to have a plurality of vertical plates and a plurality of die package regions. In addition, the package comprises a plurality of pins underside the L-shaped plate, therefore the package can be taken as a card structure. The package after an encapsulating process can be conveniently fabricated and changed by users. The dies and the interior circuit are prevented from damage.

These and other objectives of the present invention will no doubt become obvious to those of ordinary skill in the art after reading the following detailed description of the preferred embodiment that is illustrated in the multiple figures and drawings.

DETAILED DESCRIPTION

Reference will now be made in detail to the preferred embodiment of the present invention, examples of which are illustrated in the accompanying drawings.

Figure 1:
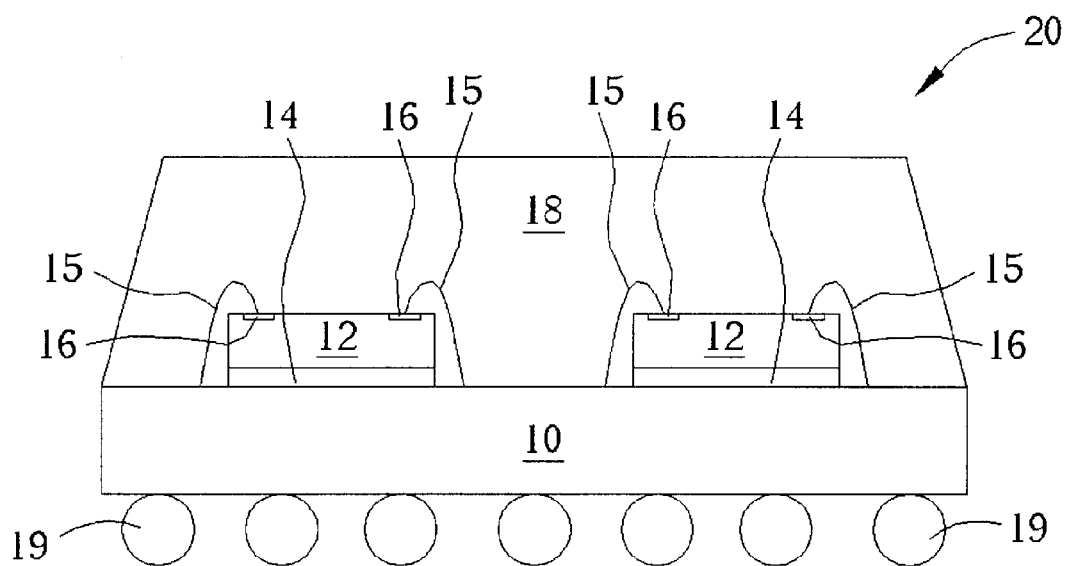
FIG. 1 to FIG. 2 are schematic diagrams of a multi-die package according to the prior art structure.
Figure 2:
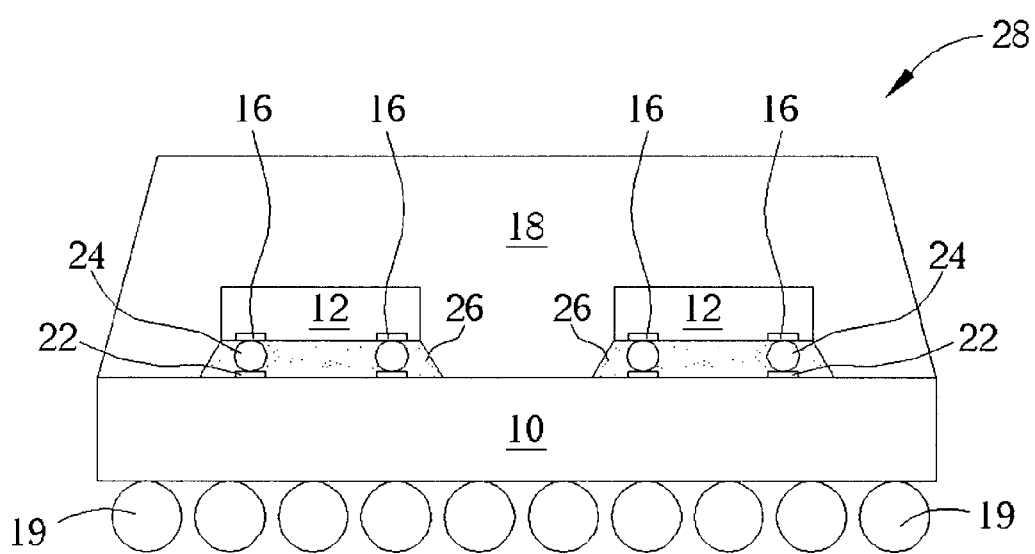
Figure 3:
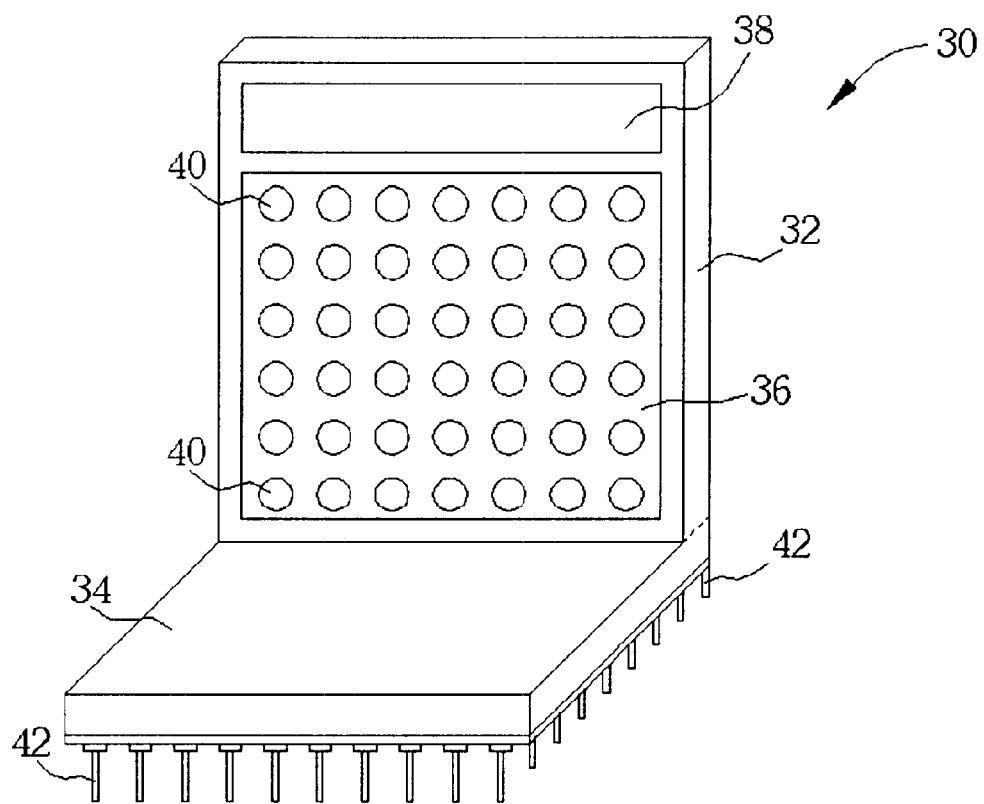
FIG. 3 is a front view of a L-shaped plate structure according to the present invention.

Referring to FIG. 3, an L-shaped plate 30 is used as a package substrate of a multi-die package 60 in the present invention. The L-shaped plate 30 comprises a vertical plate 32 connected to a horizontal plate 34. The L-shaped plate 30 is a conventional laminate substrate and made of FR-4, FR-5 or Bismaleimide-Triazine (BT). A die package region 36 and a peripheral region 38 are located on a surface of the vertical plate 32. A plurality of bump pads 40 are arrayed in the die package region 36. A plurality of pins 42 arranged as a grid array or specialized grid array, are located on the underside of the horizontal plate 34 and electrically connected to a printed circuit board (PCB)(not shown). An internal circuit (not shown) is arranged inside the L-shaped plate 30 and electrically connected to the plurality of bump pads 40 and corresponding pins 42. An interior of the peripheral region 38 has a control circuit (not shown) and the control circuit is used to control circuit connections in the interior of the L-shaped plate 30.

Figure 4:
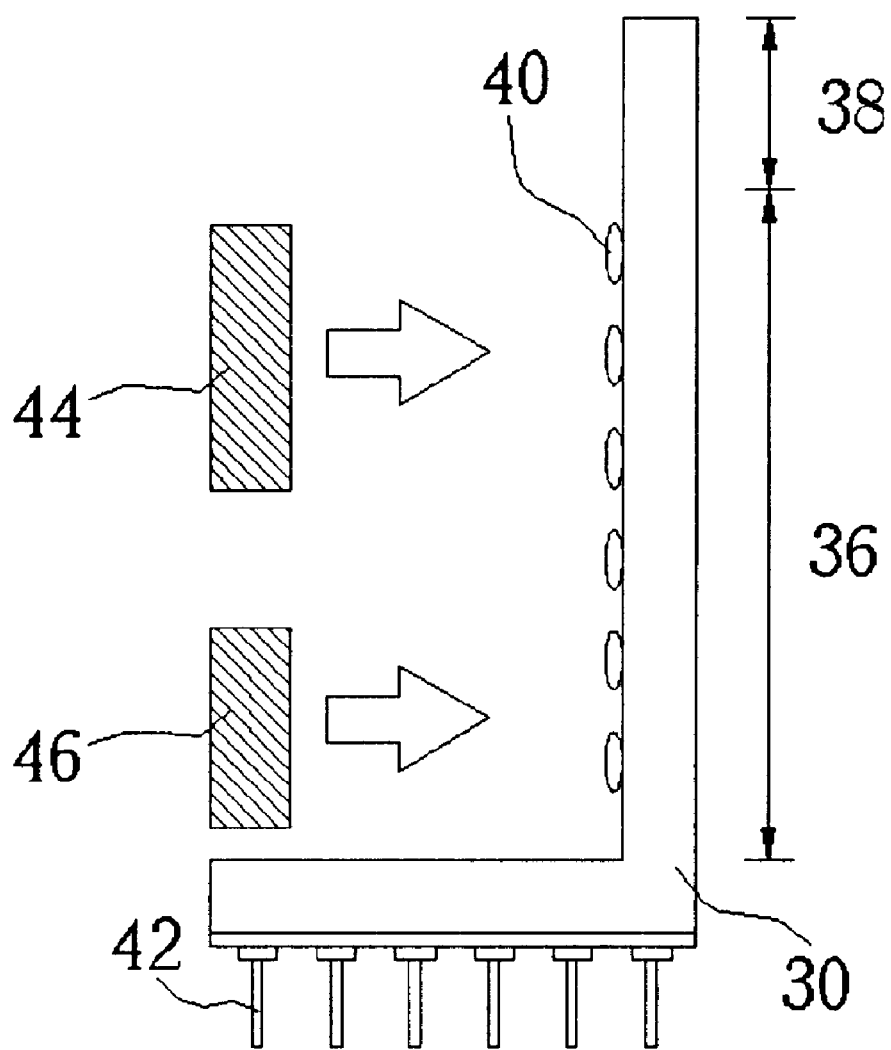
FIG. 4, is a cross-sectional diagram of a multi-die package according to the present invention.

Referring to FIG. 4, a die 44 is arranged in a predetermined region of the die package region 36. Another die, such as a die 46 can subsequently be arranged in the other region of the die package region 36 according to IC designs. The die 44 and the die 46 are either a logic circuit die, a static random access memory (SRAM) die, a dynamic random access memory (DRAM) die, a central process unit die or a flash memory die.

Figure 5:
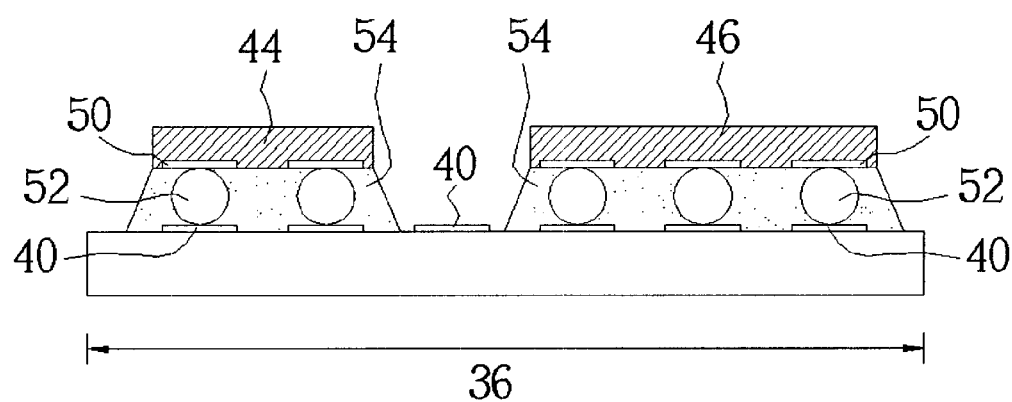
FIG. 5 is a detailed sectional view of the multi-die package according to the present invention.

Referring to FIG. 5, a plurality of bonding pads 50 are located on an active surface of the die 44 and 46 and electrically connected to the corresponding bump pads 40 of the die package region 36. As the active surfaces of the die 44 and 46 are exposed to the surface of the L-shaped plate 30, therefore, the bonding pads 50 and the corresponding bump pads 40 are electrically connected to each other by using a flip chip technique. A plurality of solder bumps 52, made of gold or tin/lead alloy, or conductive polymer bumps (not shown) are located between the bonding pads 50 and the solder bump pads 40. The solder bumps 52 are used forstability and are electrically connected to the dies 44 and 46 and the bump pads 40.

In order to prevent the solder bumps 52 from cracking due to the heat cycle and heat stress, a filling material 54, made of liquid package material, epoxy or anisotropic conductive film (ACF), is used between the dies 44, 46, the die package region 36 and the solder bumps 52 to form an epoxy underfill layer. In addition, in order to improve the heat dissipation of the present invention, a heat sink (not shown) can be positioned behind the dies 44 and 46. The heat sink and the dies 44 and 46 are thermally coupled.

Figure 6:
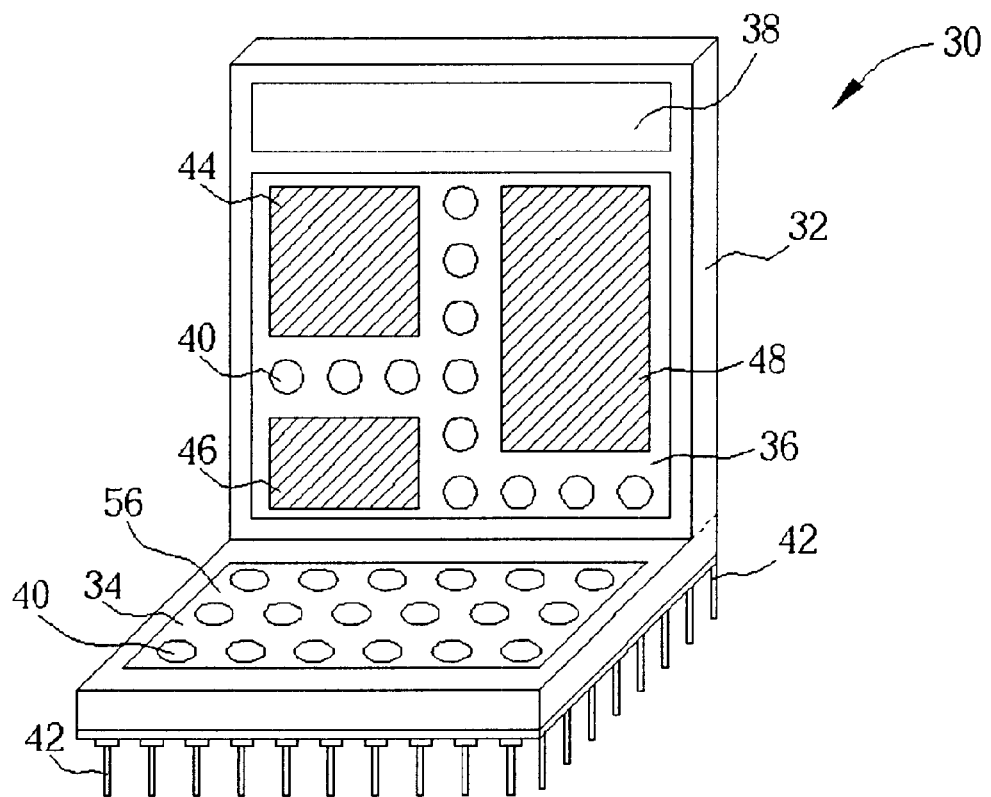
FIG. 6 is a front view of the multi-die package according to the present invention.

Referring to FIG. 6, if the dies are too numerous to be packed in the die package region 36, the dies can be arrayed in another die package region 56 of the horizontal plate 34, or a backside of the vertical plate 32. Similarly, the die package region 56 or a die package region (not shown) of the backside of the vertical plate 32 also has the plurality of bump pads 40.

Figure 7:
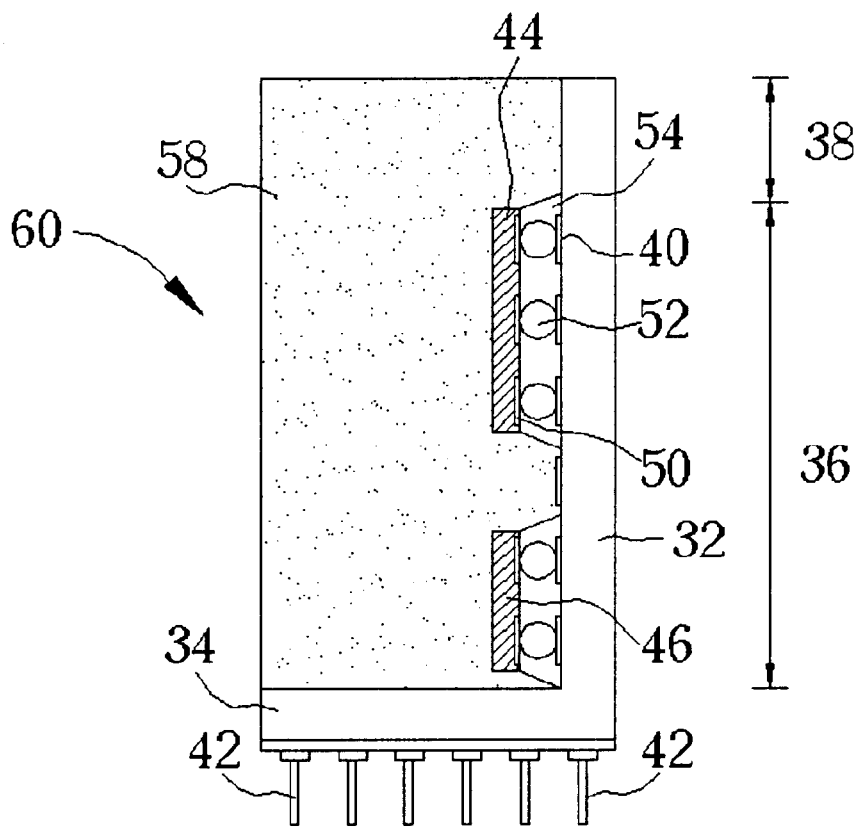
FIG. 7 is a cross-sectional diagram of the multi-die package according to the present invention.

Finally referring to FIG. 7, the finished arrangement of multi-die package 60 is immersed into a molding compound 58. The molding compound 58 comprises silica gel, epoxy, polymide (PI), parylene or silicon polymide. An encapsulating process is performed to enclose the L-shaped plate 30, the dies 44 to 48, and a connecting part of the L-shaped plate 30 and the dies 44 to 48 to prevent damage to the multi-die package 60 from the surrounding environment, human contact or moisture content. Thus, the fabricating method of the multi-die package 60 is complete. Furthermore, an internal circuit (not shown) is arranged inside the L-shaped plate 30 electrically connected to the plurality of bump pads 40 and corresponding pins 42. Therefore, the multi-package 60 can be connected with a conductive region of PCB, such as a motherboard by the pins 42 and fabricated on the PCB.

Figure 8:
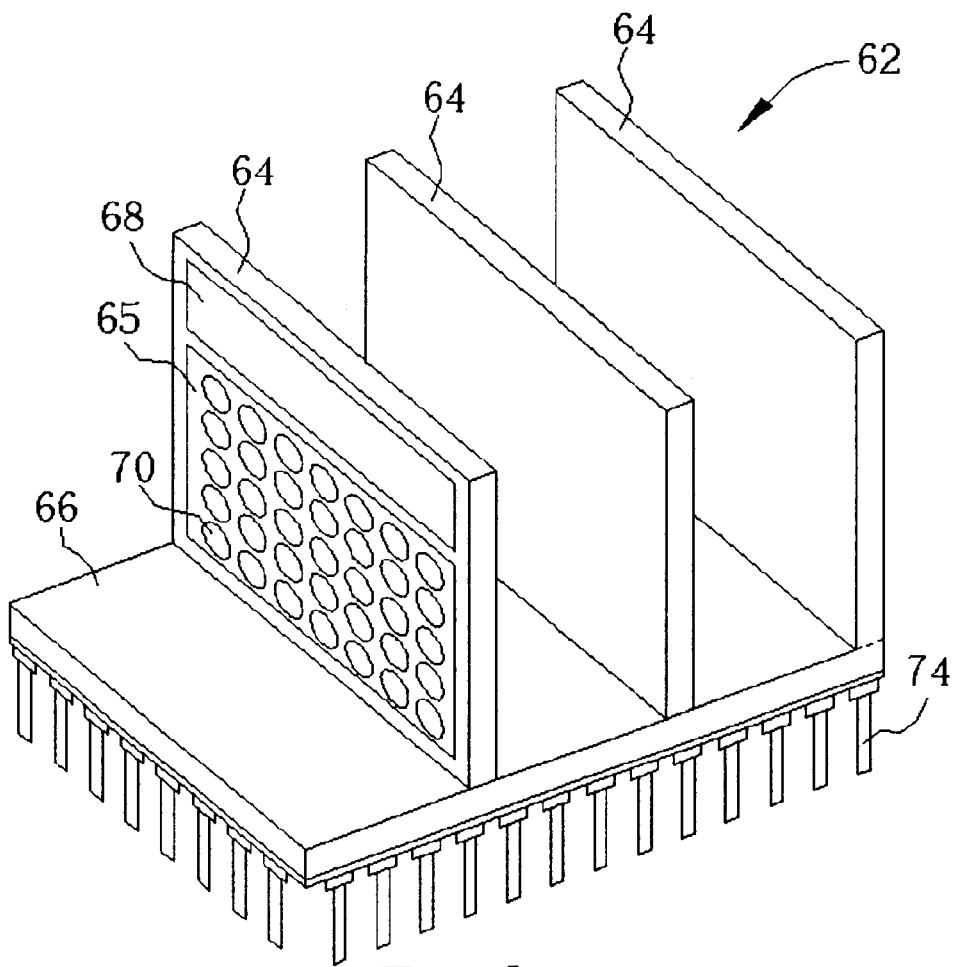
FIG. 8 is a front view of a plate structure according to a second embodiment of the present invention.
Figure 9:
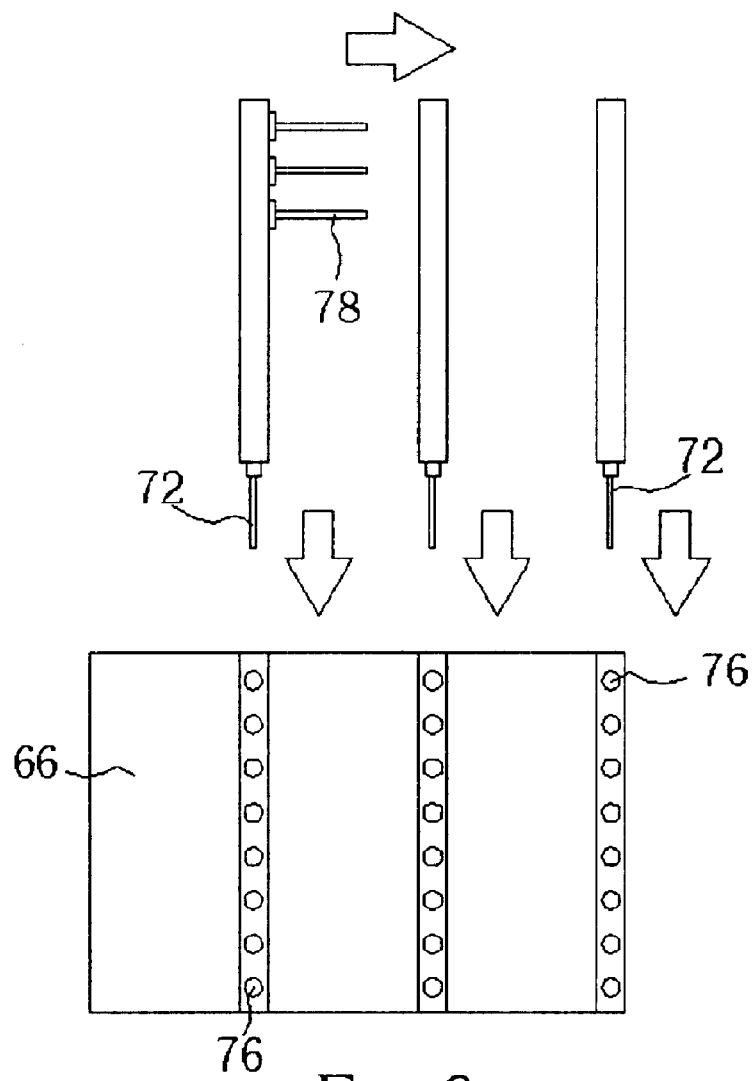
FIG. 9 is a cross-sectional diagram of the plate structure according to the second embodiment of the present invention.

A second embodiment of a multi-die package 92 is explained with reference to FIG. 8 to FIG. 10. Referring to FIG. 8 and FIG. 9, a plate structure 62 comprises at least one vertical plate 64 and a horizontal plate 66 connected with the vertical plate 64. The plate structure 62 is a conventional laminate substrate and made of FR-4, FR-5 or Bismaleimide-Triazine (BT). The embodiment utilizes three vertical plates 64 as an example. A die package region 65 and a peripheral region 68 are located on each surface of the vertical plate 64. A plurality of bump pads 70 are arrayed in the die package region 50. A plurality of terminals 72 are located on the underside of the vertical plate 64 and inserted into corresponding holes 76 of the horizontal plate 66. The terminals 72 are electrically connected to the vertical plate 64 and the horizontal plate 66. A plurality of outer terminals 74 are located underside of horizontal plate 66 and are inserted to a PCB (not shown) electrically. An internal circuit (not shown) is arranged inside the vertical plate 64 and the horizontal plate 66 electrically connected to the plurality of bump pads 70 and the corresponding outer terminals 74. An interior of the peripheral region 68 has a control circuit (not shown). The control circuit is used to control circuit connections in the interior of the plate structure 62. In addition, a plurality of holes (not shown) are located on a frontside of the vertical plate 64, and corresponding terminals 78 are located on a back side of the vertical plate 64. Each vertical plate 64 is connected with the other. The terminals 72, the outer terminals 74 and the terminals 78 are consist of pins or solder balls arranged as grid arrays or specialized grid arrays.

Figure 10:
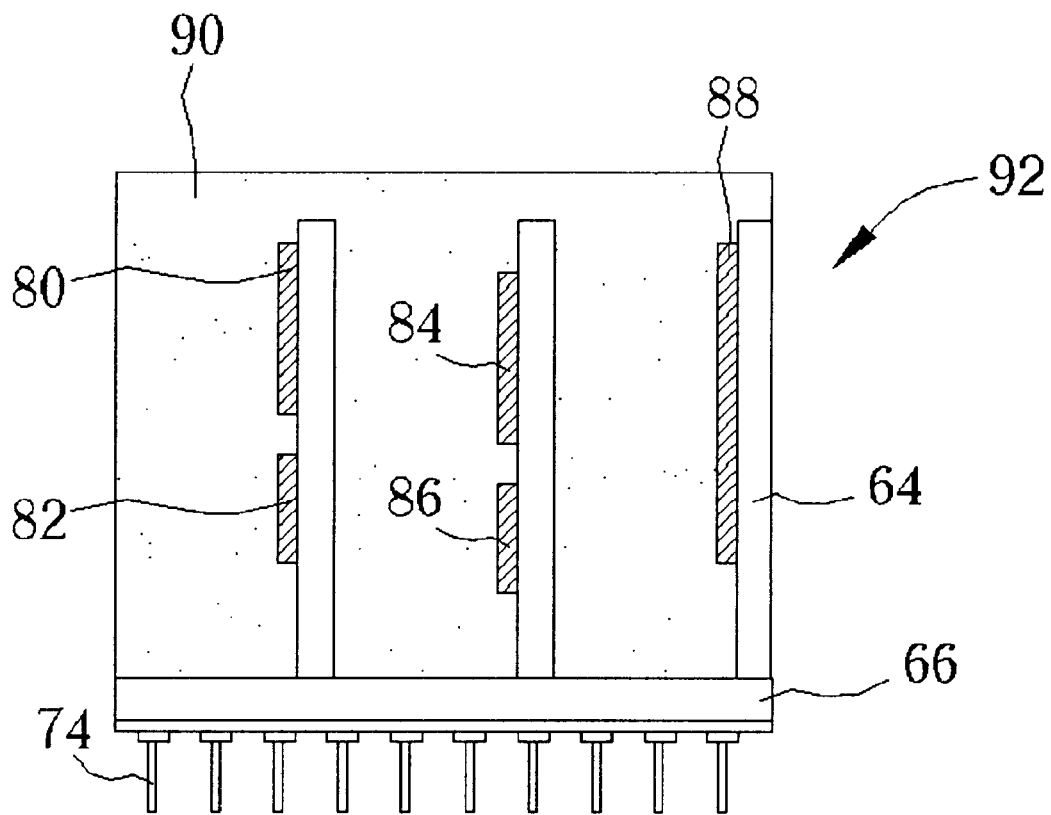
FIG. 10 is a cross-sectional diagram of the multi-die package according to the second embodiment of the present invention.

Referring to FIG. 10, this embodiment utilizes five dies 80 to 88 as an example. The dies 80 to 88 are respectively arranged in the die package region 65. Finally, a molding compound 90, such as epoxy is used to enclose the plate structure 62 and the dies 80 to 88. Thus, the multi-die package 92 is complete. The dies 80 to 88 can be arranged in the die package region 65 by using a wire bonding or a flip chip technique as referred to in FIG. 5.

The present invention utilizes the L-shaped plate as a package frame to enclose a plurality of dies with identical or different functions in the die package region of the L-shaped plate for forming a system on package. If too many dies are to be enclosed in the same package, the L-shaped plate can be extended to have a plurality of vertical plates and a plurality of die package regions. In addition, pins are used as the terminals in the present invention, due to the pin package being an area array with higher integration. However, another type of pins, such as electronic-connected pins can also be used in the multi-die package of the present invention.

The packaged system after the encapsulating process is considered a card structure. Therefore, the package is conveniently fabricated and easily changed by users. Furthermore, the dies and the interior circuit are prevented from damage.

In the prior art multi-die package, the dies are arranged on the PCB directly. In the present invention, the dies are arranged in the die package region of the L-shaped plate first, and then the L-shaped plate is electrically connected to the PCB. The dies in the multi-die package in the present invention can be protected from the surrounding environment and their sizes are standardized. The advantages of the present invention are described below:

1. As a plurality of dies are arranged on the L-shaped plate, therefore the signal transition path between each die is decreased, the circuit resistance is reduced, the signal delay is diminished, the signal transition speed is increased and the bulk efficiency is raised.

2. The size of package is reduced and the integration is higher.

3. The limitless extension of the plate structure to accommodate more dies.

4. A pin package is utilized, which is convenient to fabricate and dismantle by users.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A multi-die package comprising:
    an L-shaped plate comprising a die package region, a plurality of solder bump pads disposed in the die package region, a plurality of pins electrically connected to a printed circuit board (PCB), and an internal circuit arranged inside the L-shaped plate electrically connected to the plurality of solder bump pads and corresponding pins; and
    a plurality of dies arranged in the die package region of the L-shaped plate, each die comprising a plurality of bonding pads on an active surface of the die, the bonding pads being electrically connected to corresponding solder bump pads, and a number of the solder bump pads being not less than a number of the bonding pads.

2. The package of claim 1 wherein the bonding pads of the dies are electrically connected to the corresponding solder bump pads of the L-shaped plate by a flip chip technique.

3. The package of claim 2 wherein the package further comprises a plurality of solder bumps disposed between the plurality of bonding pads and the plurality of solder bump pads so as to electrically connect the dies with the solder bump pads.

4. The package of claim 1 further comprising a molding compound for packaging the L-shaped plate and the plurality of dies.

5. The package of claim 4 wherein the molding compound comprises silica gel, epoxy, polymide (PI), parylene or silicon polymide.

6. The package of claim 1 wherein the plurality of pins are packaged into a can package, a dual-inline package (DIP), a flat package (FP), a pin grid array (PGA), a chip carrier or a tape carrier package.

7. The package of claim 1 wherein the L-shaped plate further comprises a peripheral region having a control circuit.

8. The package of claim 1 wherein the dies comprise a logic circuit die, a static random access memory (SRAM) die, a dynamic random access memory (DRAM) die, a central process unit die or a flash memory die.

9. A system on chip (SOC) package for packaging a plurality of dies simultaneously comprising:
    a plate structure comprising at least one vertical plate connected with a horizontal plate, the vertical plate comprising a die package region, a plurality of solder bump pads disposed in the die package region, a plurality of outer terminals, and an internal circuit inside the plate structure electrically connected to the plurality of solder bump pads with corresponding outer terminals; and
    a plurality of dies arranged in the die package region of the vertical plate, each die comprising a plurality of bonding pads on an active surface of the die, the bonding pads being electrically connected to corresponding solder bump pads, and a number of the solder bump pads being not less than a number of the bonding pads.

10. The package of claim 9 wherein the plurality of outer terminals are electrically connected to a printed circuit board (PCB).

11. The package of claim 9 wherein the plurality of outer terminals are electrically connected to each vertical plate.

12. The package of claim 9 wherein the plurality of outer terminals are packaged into a can package, a dual-inline package (DIP), a flat package (FP), a pin grid array (PGA), a chip carrier or a tape carrier package.

13. The package of claim 9 wherein the bonding pads of the dies are electrically connected to the corresponding solder bump pads of the vertical plate by a flip chip technique.

14. The package of claim 13 wherein the package further comprises a plurality of solder bumps disposed between the plurality of bonding pads and the plurality of solder bump pads so as to electrically connect the dies with the solder bump pads.

15. The package of claim 9 further comprising a molding compound for packaging the plate structure and the plurality of dies.

16. The package of claim 15 wherein the molding compound comprises silica gel, epoxy, polymide (PI), parylene or silicon polymide.

17. The package of claim 9 wherein the vertical plate further comprises a peripheral region having a control circuit.

18. The package of claim 9 wherein the dies comprise a logic circuit die, a static random access memory (SRAM) die, a dynamic random access memory (DRAM) die, a central process unit die or a flash memory die.

* * * * *